United States Patent
Giefers

(10) Patent No.: US 8,366,471 B2
(45) Date of Patent: Feb. 5, 2013

(54) CONNECTION AND JUNCTION BOX FOR A SOLAR MODULE

(75) Inventor: Stefan Giefers, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 539 days.

(21) Appl. No.: 12/525,794

(22) PCT Filed: Feb. 4, 2008

(86) PCT No.: PCT/EP2008/000858
§ 371 (c)(1),
(2), (4) Date: Mar. 1, 2010

(87) PCT Pub. No.: WO2008/095669
PCT Pub. Date: Aug. 14, 2008

(65) Prior Publication Data
US 2010/0173511 A1    Jul. 8, 2010

(30) Foreign Application Priority Data

| Feb. 5, 2007 | (DE) | ......................... | 10 2007 006 433 |
| Aug. 7, 2007 | (DE) | ......................... | 10 2007 037 130 |
| Sep. 7, 2007 | (DE) | ......................... | 10 2007 042 547 |
| Oct. 24, 2007 | (DE) | ......................... | 10 2007 051 134 |

(51) Int. Cl.
*H01R 13/62* (2006.01)
(52) U.S. Cl. ........................ 439/329; 439/259
(58) Field of Classification Search .................. 439/259, 439/725, 76.1
See application file for complete search history.

(56) References Cited

U.S. PATENT DOCUMENTS

| 4,460,232 | A | * | 7/1984 | Sotolongo | ..................... 439/535 |
| 7,648,371 | B2 | * | 1/2010 | Boensch et al. | ............. 439/76.1 |
| 7,824,190 | B2 | * | 11/2010 | Beck et al. | .................... 439/76.1 |
| 8,113,853 | B2 | * | 2/2012 | Coyle et al. | .................... 439/76.1 |
| 2006/0049802 | A1 | | 3/2006 | Higashikozono et al. | |

FOREIGN PATENT DOCUMENTS

| DE | 203 11 184 U1 | 3/2004 |
| DE | 10 2004 020 958 B3 | 8/2005 |
| DE | 10 2004 020958 B3 | 8/2005 |
| DE | 103 58 140 | 9/2005 |
| DE | 20 2005 018 884 | 3/2006 |
| DE | 10 2005 025 632 | 12/2006 |
| EP | 1 102 354 A | 3/2001 |
| EP | 1 672 702 A | 6/2006 |
| JP | 2002359389 | 12/2002 |
| JP | 2006278425 | 10/2006 |
| WO | WO 2007/118798 | 10/2007 |

* cited by examiner

*Primary Examiner* — Tulsidas C Patel
*Assistant Examiner* — Travis Chambers
(74) *Attorney, Agent, or Firm* — Reising Ethington PC

(57) ABSTRACT

A connection and junction box for a photovoltaic solar module having flexible flat conductor bands protruding from the surface of the solar module, wherein the connection and junction box has an insertion mouth at its side in mounting state facing the solar module, for at least one of the flexible flat conductor bands of the solar module, as well as comprising a housing for attaching to the solar module, and a connection device for the flexible flat conductor band, positioned in the housing, the connection device has a deflection arm and an electrical contact clamp, which is actuated when attaching the box to the solar module for bending and contacting the flat conductor band.

15 Claims, 3 Drawing Sheets

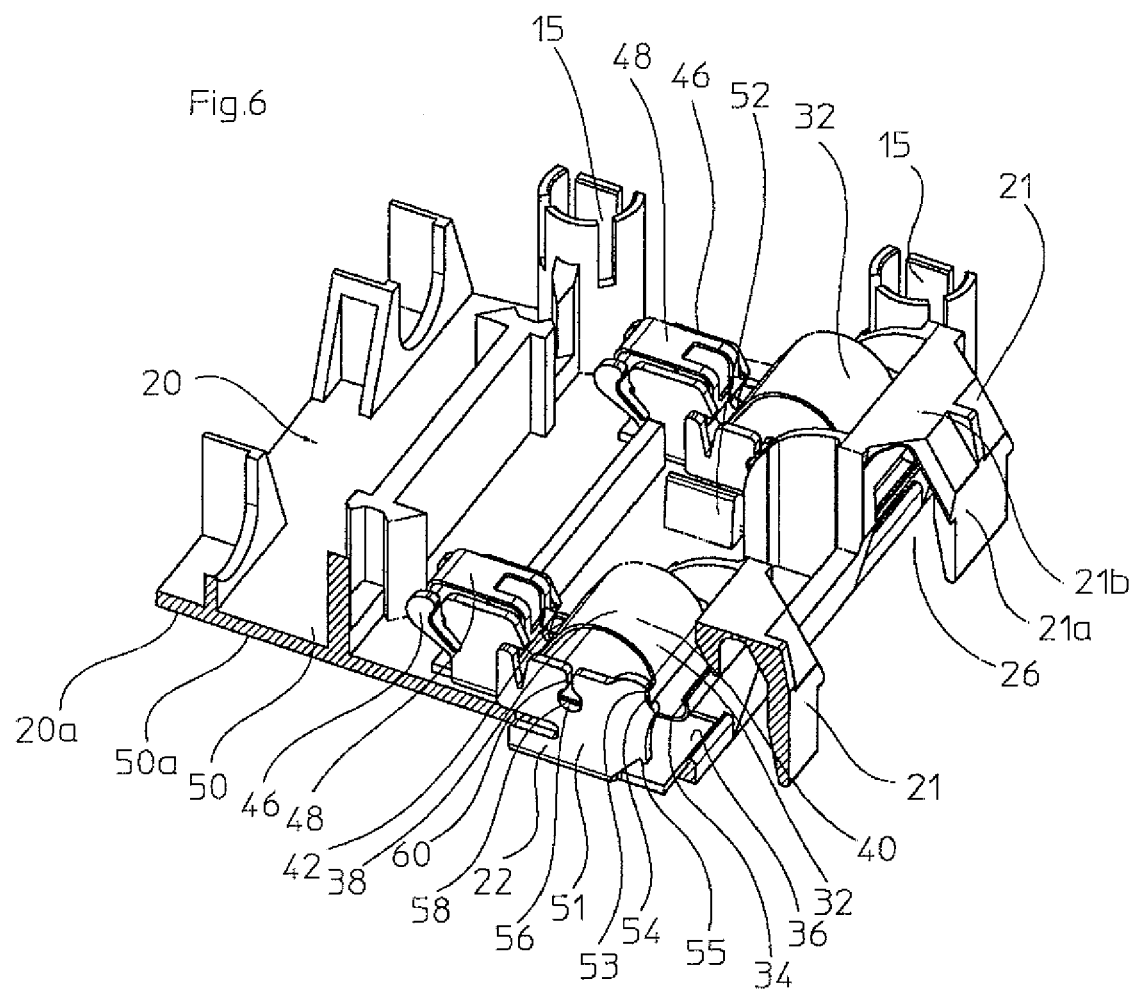

CONNECTION AND JUNCTION BOX FOR A SOLAR MODULE

FIELD OF THE INVENTION

The invention relates to a connection and junction box for a photovoltaic solar module having flexible flat conductor bands protruding from the surface of the solar module, and to a method for connecting a connection and junction box to a solar module.

BACKGROUND OF THE INVENTION

Over the past years, producing photovoltaic solar modules has literally been booming, inter alia due to the increased demand on environmentally sound energy production. The direct conversion of sunlight into electric current by means of photovoltaic solar modules is entirely emission-free, and no risks for humans and the environment are almost involved. For example, complete roofs of new buildings are therefore recently overlaid with solar modules, and even "solar power plants" are built. Due to the technical development of photovoltaics, using solar modules more and more becomes efficient even in more unfavourable latitudes such as Middle Europe and Northern America so that especially in these regions there is a great demand. Due to the continuous progress of the efficiency of solar modules due to technical further development on the one hand as well as increasing costs of energy production with other energy carriers as fossil fuels or nuclear energy, photovoltaic power generation becomes more and more competitive.

It is apparent that the success of solar modules in economic competition with other energy carriers depends on the costs of producing and mounting the solar modules.

Typically, solar modules consist of a plurality of solar cells based on semiconductor technique, which cells are interconnected to large-scale solar panels. A typical solar module has a glass plate on its side facing the sun, and a transparent plastics layer on the rear side, in which layer the solar cells are embedded. Typically, the rear side of the solar module is covered with a weather-resistant plastics compound foil, for example polyvinyl fluoride and polyester. The mono- or polycrystalline solar cells are electrically interconnected to each other by means of small solder wires. Typically, the solar module is furthermore mounted in a metal profile frame for fixing and stiffening the compound. Therefore, a solar module basically is a two-dimensional entity, similar to a glass plate.

Typically, solar modules have thin flexible conductor bands on the side facing away from the sun. These bands are mostly made of copper and vertically protrude from the rear side of the solar module. These flexible conductor bands are very sensitive and therefore difficult to contact. Additionally, a mechanical charge for fixing an electrical connector is also difficult because of the disk-like form of the solar module. Therefore, a special kind of electrical connectors has evolved for such solar modules, which kind is called connection box or connection and junction box. Typically, the connection and junction box is glued on the rearward surface of the solar module, and has electrical connection devices inside for contacting the flexible flat conductor bands of the solar module. Furthermore, if needed, the connection and junction box has an apparatus for connecting an electrical connection cable, which is connected with the flexible flat conductor band of the solar module by means of the connection and junction box for conducting the electrical current generated by the solar module.

Furthermore, several solar modules are typically operated in series connection, wherein a so-called bypass diode or free-wheeling diode is anti-parallel connected to each module. Inside the connection and junction box, the free-wheeling diode is connected to the electrical connection device. If a module is shaded or does not produce electricity because of a defect, this module would lower the power of the solar modules in series connection or even suffers damage without bypass diode. This is avoided by the bypass diode, because the current flows through the diode and is sustained.

It is apparent that due to the mechanical conditions, particularly the form of the solar module and the sensitiveness of the flexible flat conductor bands, a number of difficulties occur, when constructing the connection and junction box. Up to now, connection boxes are known, which are put over the flexible flat conductor bands. When doing so, the flexible flat conductor band is manually bent and contacted by means of a contact clamp or a soldered connection. The connection box is closed in a further process step. Such connection arrangements or connection boxes respectively are described in DE 10 2005 025 632 A1 and DE 20 2005 018 884 U1. It is apparent that mounting such connection devices or connection boxes respectively is laborious, and is badly suited for automated mass production.

An electrical connection and junction box for a solar module is known from DE 103 58 140 B4, which box has a guiding arrangement at its lower side. The thin conductor band is guided in this guiding arrangement in lateral direction with low slackness in order to avoid buckling or folding the conductor bands, when inserting into the clamp apparatus. At this, it is disadvantageous that the conductor band has to be threaded into the narrow guiding arrangement, and the clamping force of the clamp arrangement may nevertheless be relatively low to be able to insert the thin conductor band into the clamp arrangement.

After all this, there is need for improvements in this regard, due to the high pressure to innovate in producing solar modules.

SUMMARY OF THE INVENTION

Therefore, it is an object of the present invention to provide a connection and junction box for a photovoltaic solar module, which box can automatedly, for example by means of a robot, be connected to the solar module, and offers high contact reliability and long-life cycle.

It is a further object of the invention to provide such a connection and junction box, which has a kind of tolerance concerning the lateral positioning on the solar module.

It is a further object of the invention to provide such a connection and junction box, which avoids, or at least lowers the disadvantages of the state of the art, and may cost-effectively be produced as well as be mounted.

According to the invention, a connection and junction box with flexible flat conductor bands protruding from the surface of the solar module is provided. At its side facing the solar module in mounting state (hereinafter referred to as lower side), the connection and junction box has an insertion mouth for at least one flexible flat conductor band of the solar module as well as a housing for attaching to the solar module. In the housing there is a connection device for the flexible flat conductor band.

The connection device has an electrical contact clamp for establishing a clamp contact with the flexible flat conductor band, wherein the contact clamp may be in at least two defined stable states, namely an opened mounting state, in which an open or free insertion area is defined, into which the flat conductor band is substantially resistance-less insertable, and a closed contact state, in which a clamp contact is established with the flat conductor band clamped between the two clamp elements of the contact clamp. Furthermore, the connection and junction box comprises a deflection arm inside the housing, which arm bends the flexible flat conductor band into the open insertion area of the contact clamp after inserting through the insertion mouth into the connection and junction box such that the flexible flat conductor band is gripped by the contact clamp and electrically contactable only after insertion.

The connection and junction box according to the invention may easily be mounted, particularly by means of a robot arm. It is advantageous that the flexible flat conductor band is inserted in a resistance-less, and even contactless manner, if needed, into the insertion mouth besides the contact clamp, and therewith outside the contact or insertion area so that damaging the sensitive flat conductor band is avoided. Particularly, the insertion mouth may be chosen relatively large so that there is a kind of tolerance concerning the lateral arrangement of the connection and junction box on the solar module, and that it is avoided that the conductor band abuts against parts of the connection and junction box.

Furthermore, due to bending the flat conductor band may course diagonally or even parallelly to the surface of the solar module at the clamp position so that the clamping force of the contact clamp may act diagonally or even perpendicularly to the surface of the solar module. Furthermore, bending causes some movability of the flat conductor band, what may contribute to long-life cycle.

Operating the deflection arm is preferably effected by a first actuation element, which is mounted at the housing, and is built in one piece with the housing, if needed. Purposefully, the first actuation element is constructed in the form of a cam, which applies a force to the deflection arm. For this, the housing and the connection device are two-parts and movable with respect to each other. In response to a movement of the housing relatively to the connection device, the cam actuates the deflection arm, in order to thus automatically cause bending the flexible flat conductor band.

Preferably, the housing has a second actuation element, which also automatically closes the contact clamp in response to the movement of the housing relatively to the connection device in order to establish the electrical contact with the flat conductor band, after this was bent off by the deflection arm into the insertion area still being open during bending. For example, the second actuation element is constructed as actuation pin, protruding into the housing and is formed integrally with the housing. But also the housing cap itself may serve as first and/or second actuation element, if this is permitted by the spatial arrangement. Thus, the contact clamp is actively closed by means of the second actuation element not until the flat conductor band is inserted into the contact clamp so that the sensitive flat conductor band does not need to press open the contact clamp, as it is the case with other connection and junction boxes.

The relative movement of the housing and the connection device is preferably implemented as linear shifting, i.e. that a sliding arrangement is provided between the housing and the connection device. Furthermore, actuating the deflection arm and the contact clamp takes place after each other so that with the attaching process in response to the relative movement, the first actuation element firstly actuates the deflection arm, and then the second actuation element closes the contact clamp in order to finally establish the electric contact with the flat conductor band. In the closed contact state, the flat conductor band is clamped in the contact clamp with a predefined clamping force.

According to a simple arrangement, the sliding arrangement comprises a guide sleeve at the connection device and an alignment pin at the housing, or vice versa. Alignment pin and guide sleeve are self-locking, wherein the locking or gripping may be overcome by a predefined application of force so that the housing may be taken by a robot arm, and attached to the solar module from above. But when doing so, the connection device in the housing is secured against falling off. In this first or mounting state, the connection device protrudes from the housing so that firstly, only the connection device engages the solar module, when being attached. In a further continuation of the mounting process, a force is applied to the housing in a direction orthogonal to the solar module, wherein the connection device supports itself on the solar module. By applying a force, the gripping between the housing and the connection device is overcome so that with the housing moving relatively to the connection device, the housing is shifted till it engages the solar module. Due to the relative movement, the deflection arm is actuated and the contact clamp is closed one after the other inside the housing.

This has the advantage that in case of an automated mounting of the connection and junction box on the solar module, only one work step with a linear movement has to be carried out. This is particularly easy for a mounting robot.

The deflection arm purposefully comprises a holding section, which is attached to the connection device, and a bending arm bending off the flexible flat conductor band. The holding section and the bending arm are one-piece connected with each other by means of a notch hinge so that the bending arm can be pivoted with respect to the holding section.

Preferably, the contact clamp has a clamp spring and a counter clamp element, of which at least one of the two has electric contact section, and wherein the electric contact with the float conductor band is closed by means of an active movement of the clamp spring or the counter clamp element, in response to actuation by means of the second actuation element. For this, it may easily be implemented to pivotably mount the clamp spring at the connection device, and to close the electric contact with the flat conductor band by means of pivoting the clamp spring, in response to the actuation by means of the second actuation element. At this, a clamp section of the clamp spring covers the catch area between the clamp spring and the counter clamp element for catching the bent flat conductor band. Thereby, the catch area is preferably relatively large during bending. It is free of resistance and barriers so that the danger of damaging the flat conductor band is avoided during bending.

In a preferable manner, a high and predefined clamp and contact force may be generated by means of actively closing the contact clamp after inserting and bending the flat conductor band.

According to one preferred embodiment of the invention, the leaf spring-like clamp spring has an actuation section, by mean of which the second actuation element of the housing acts together for closing the contact clamp, wherein the actuation section comprises a curved and an substantially linear section of the clamp spring. Hereby, a constant clamp and contact force is ensured so that contacting has a permanent quality.

Purposefully, the contact clamp has s metallic and generally U-shaped holding frame, in which the clamp spring is pivotably mounted in bearing openings by means of bearing studs. The holding frame is slotted towards the bearing openings so that the bearing studs can be inserted through the slots during pre-mounting the connection and junction box, Preferably, a cable connection clamp is additionally provided at the holding frame for connecting the connection cable, i.e. preferable a stripped round conductor. Preferably, the cable connection clamp has a second clamp spring for closing the electric contact with the connection cable.

Furthermore preferably, the contact clamp has a latching mechanism, by means of which the clamp spring is latched in the contact state, for example by latching notches of the clamp spring in the holding frame. In the closed and latched state, the contact clamp is under a predefined tension. Furthermore preferably, the contact clamp has a clamp mechanism holding the contact clamp in the open position. For closing the contact clamp, the gripping of the clamp mechanism is overcome by applying a force by means of the second actuation element.

Preferably, the connection device has a dielectric carrier, at which the guide sleeves are preferably one-piece are fastened, and in which carrier the holding frame is latched by means of reciprocal snap-fits. Thus, the dielectric carrier forms the bottom of the connection and junction box.

In the following, the invention is described in more detail on the basis of exemplary embodiments, and with reference to the figures, wherein same and similar elements are partially provided with the same reference numerals. Furthermore, it is apparent that orientation specifications like "below" or "lower side" are not to be understood in the sense of absolute orientation in space, but relatively with respect to the solar module, because the connection and junction box is mounted on the averted "rear" side when operating the solar module. Therefore, the lower side indicates the side facing the solar module, when mounted.

BRIEF DESCRIPTION OF THE DRAWINGS

It is shown.

DETAILED DESCRIPTION OF THE INVENTION

Figure 1:
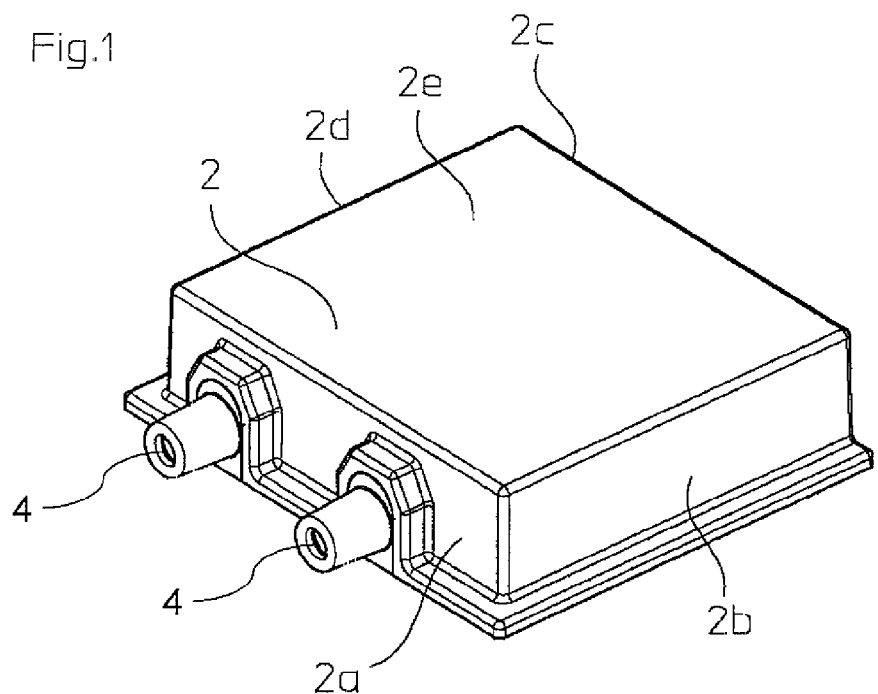
FIG. 1 a perspective view from above onto the housing of the connection and junction box, FIG. 2 a perspective vied from below onto and into the housing of the connection and junction box, FIG. 3 a cross-section of the connection and junction box with the electric connection device in open mounting state, across the solar module, FIG. 4 a cross-section of the connection and junction box with the electric connection device in intermediate state, across the solar module, FIG. 5 a cross-section of the connection and junction box with the electric connection device in closed contact state, across the solar module, and FIG. 6 a perspective, partially sectional view of the connection device.
Figure 2:
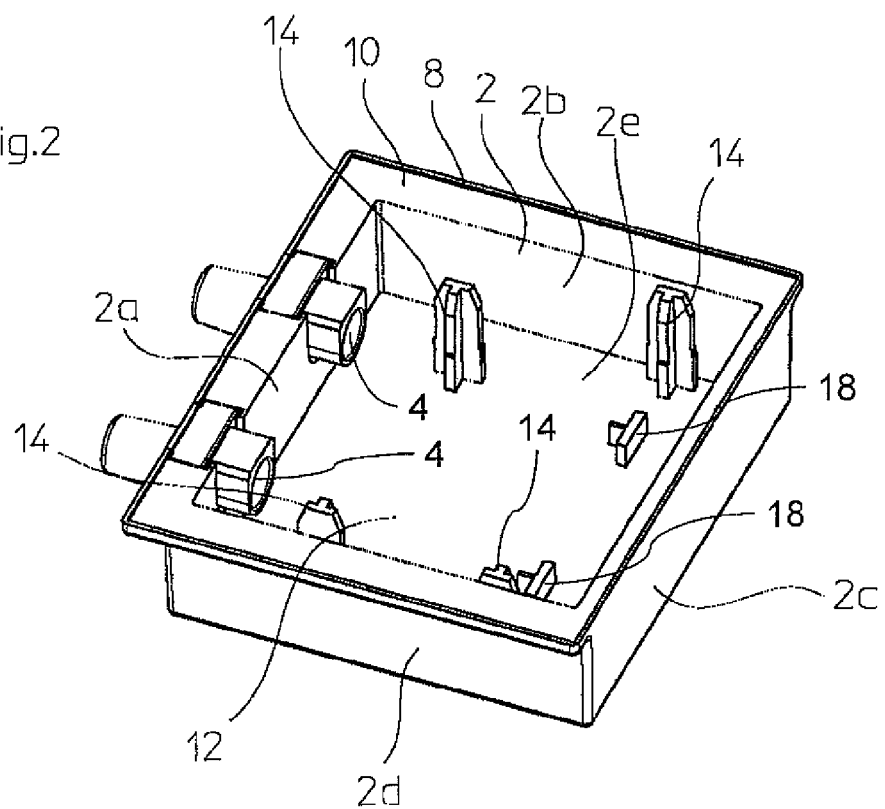

With reference to FIGS. 1 and 2, the connection and junction box has a housing made from plastic. The housing 2 is provided by an substantially rectangular frame consisting of four side walls 2a to 2d, and a closed cap 2e, which connects the four side walls and proceeds parallelly to the solar module. The five-sided, closed housing 2 being open downwards is die cast in one piece, for example. The connection cable (not shown) is guided outwards through connection cable feedthroughs 4.

With reference to FIG. 2, the housing 2 is open downwards, and has a protruding holding frame 8 with a circular glue notch 10 so that the housing 2 has a hat-like form. The housing is permanently glued on the solar module, and sealed by means of the glue brought into the glue notch 10. The hat-like or pan-like form of the housing defines an internal hollow space 12, in which the connection device not being shown in FIG. 2 is substantially waterproof housed in mounting state. The connection device may, but does not need to, additionally be glued on the solar module by means of a thin glue layer.

Alignment pins 14 protrude from the lower side of the housing cap 2e into the hollow space 12. Furthermore, the lower side of the housing cap 12e has a first actuation arrangement 16 in the form of lateral cam for actuating the deflection arm (not shown in FIG. 2, see hereunto FIGS. 3-5). Furthermore, actuation pins 18 for actuating the contact clamp protrude from the housing cap 12e into the internal space 12. In this embodiment, the actuation arrangements 16 and 18 are integrally formed with the housing.

Figure 3:
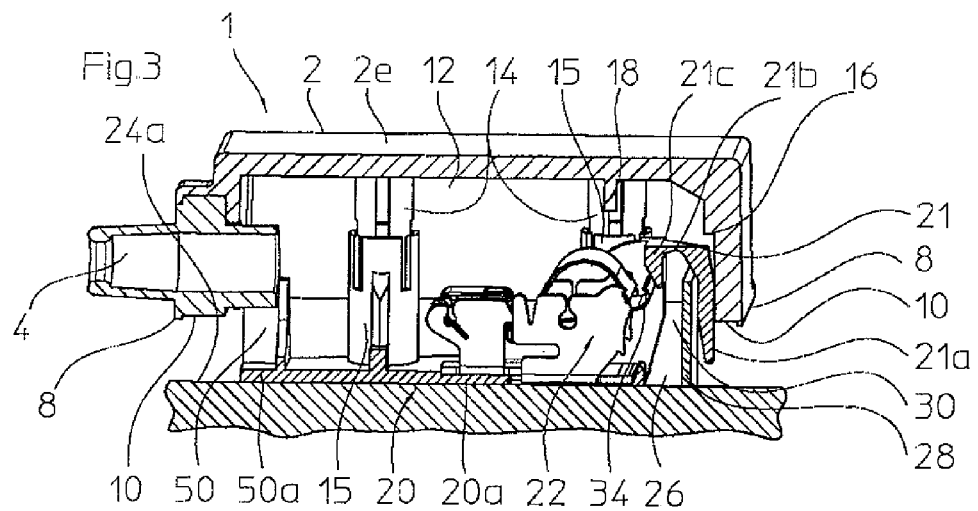
Figure 4:
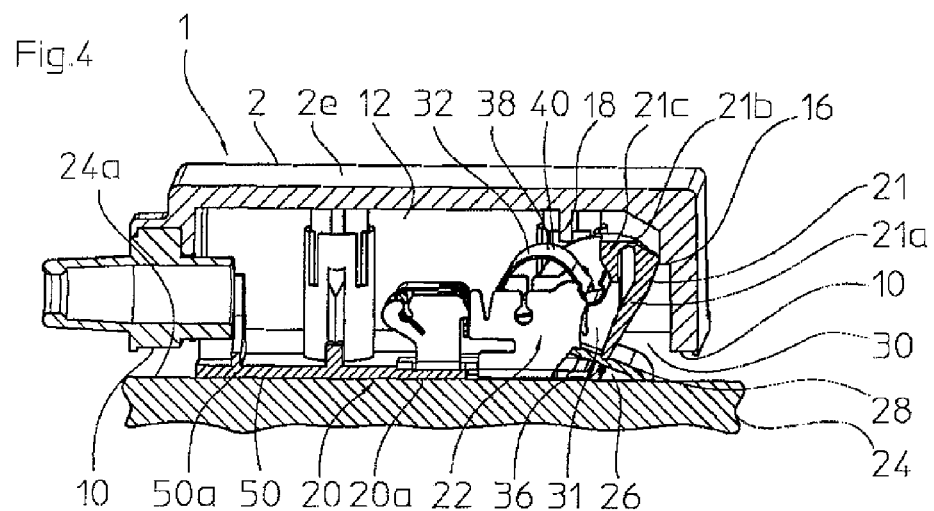
Figure 5:
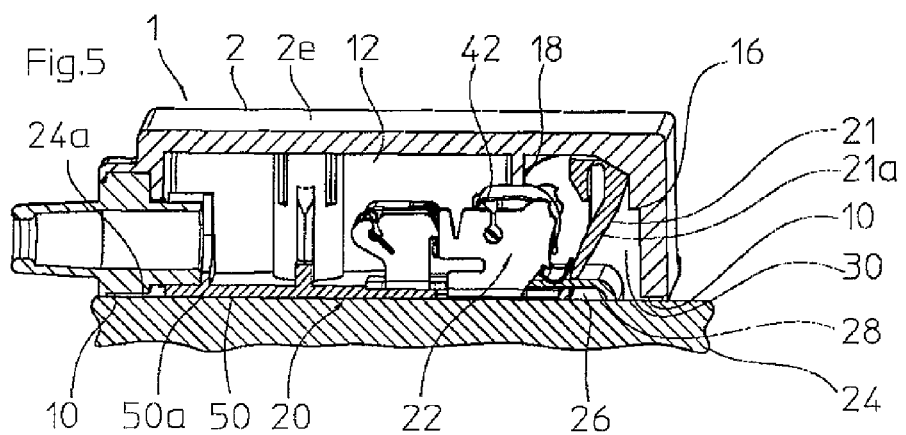

With reference to FIGS. 3-5, the connection device 20 of the connection and junction box 1 is arranged in the housing 2. FIG. 3 shows the connection and junction box, after it was put over the flat conductor band. When being put over, the connection and junction box in a first state, the mounting state, in which the deflection arm is in a first position. The insertion area 30 over the insertion opening 26 is kept free, and the contact clamp 22 is open, in the mounting state, in which the connection and junction box is preferably delivered.

The connection device 20 has guide sleeves 15, into which the alignment pins 14 are inserted. The alignment pins 14 clamp in the associated guide sleeves 15 such that when putting the connection and junction box 1 on the solar module 24, the connection device 20 is fixed in the housing 2 by gripping so that the housing may be caught and automatedly put on top by a robot, without the connection device falling off. On the other hand, the gripping between the alignment pins 14 and the guide sleeves 15 may be overcome by applying a force for shifting the housing 2 with respect to the connection device 20 to be possible. In this example, the guide sleeve has slots for improving the gripping interaction with the alignment pin 14.

In the mounting state shown in FIG. 3, the connection device 20 is not yet completely inserted into the housing 2, i.e. it protrudes a little (some millimetres) downwards from the housing 2, i.e. at the side facing the solar module. In the mounting state, therefore, there is an offset between the lower side 20a of the connection device 20 and the holding frame 8 of the housing 2 so that when putting on the connection and junction box 1, firstly the connection device 20 comes in contact with the solar module 24. In this state being shown in 3, the holding frame 8 is still spaced apart from the surface 241 of the solar module 24.

The connection and junction box 1 has a relatively large insertion opening 26 at its lower side facing the solar module 24. In the mounting state, this makes sure that the sensitive, flexible flat conductor band 28, the so-called "ribbon", is barrier-free and resistance-less inserted from below into the connection and junction box 20. The danger of damaging the flat conductor band 28 is hereby reduced. In this state, the connection and junction box 1 defines an open insertion area 30 being between the contact clamp 22 and the deflection arm 21, into which area the flat conductor band 28 resistance-less immerges from below, when putting on the connection and junction box. Preferably, the contact clamp 22 or the deflection arm 21 do still not touch the flat conductor band 28, in this state.

Now a force is applied to the housing 2 against the solar module 24 for contacting the flat conductor band, wherein the connection device supports itself at the solar module 24. Hereby, a linear movement of the housing 2 with respect to the connection device 20 is caused to that effect that the housing 2 is slided over the connection device till the holding frame 8 with the glue (not shown) in the glue notch 10 engages the surface of the solar module 24, and till the lower side of connection device 20 and the housing 2 shortly abuts on the solar module 24. This closed state is the final or operating state, and is shown in FIG. 5. In the operating state, the housing 2 is glued on the solar module by means of the glue being in the glue notch 10.

But before the connection and junction box 1 reaches the final state, it passes through the intermediate state being shown in FIG. 4, in which state the flat conductor band 28 is already bent, and the contact clamp 22 is still open. When attaching the connection and junction box 1, first of all the flat conductor band 28 is inserted into the insertion area 30. After the lower side 20a of the connection device 20 has engaged on the solar module 24, the flat conductor band 28 is successively bent into the catch area 31 of the contact clamp 22 by means of the deflection arm 21. Further successively, the contact clamp 22 is actively closed by means of the second actuation element 18. Therefore, the connection and junction box 1 defines three predefined states, namely the mounting state (FIG. 3), in which the deflection arm 21 is in a first position so that the insertion area is free, and the contact clamp 22 is open; the intermediate state (FIG. 4), in which the flat conductor band 28 is bent by the deflection arm 21 into to the catch area 31 of the still open contact clamp 22; and the final or operating state (FIG. 5), in which the contact clamp 22 is closed, and the electric contact with the flat conductor band 29 is established by means of clamp contacting.

With the shift of the housing 2 with respect to the connection device, the first actuation element 16, in this example an actuation cam, therefore interact with the deflection arm 21, and successively, the second actuation element, in this example an actuation pin, interacts with the clamp spring 32. Due to this successive actuation, firstly the bending section 21a of the deflection arm 21 is deflected in response to actuating by means of the cam 16. Successively, the contact clamp 22 is closed by pivoting the clamp spring 32. In this example, the cam 16 is formed as lug of the side wall of the housing 2, integrally form with the latter. Thereby, the clamp section 34 of the clamp spring 32 covers the catch area 31 of the contact clamp, and clamps and contacts the free end of the flat conductor band 28 between the clamp section 34 of the clamp spring 32 and the two-was clamp element 35. The bending section 21a of the deflection arm 21 is one-piece connected with a holding section 21c by means of a fold hinge 21b. The holding section 21c is attached to the connection device 20.

The clamp spring 32 has an actuation section 38, which is divided into a curved section 40, and a substantially linear section 42. When closing, the actuation element 18 firstly acts on the curved section 40 (see FIG. 4), and tightens against the linear section 42 in the closed contact state (shown in FIG. 5) of the connection and junction box 1. I.e. when closing, the actuation element 18 covers the actuation section 38 of clamp spring 32.

With reference to FIG. 6, in this example, the connection device 20 comprises two contact clamps 22 and two cable connection clamps 46 for the respective electric connection cable not being shown. In this example, the cable connection clamp 46 is also provided with a clamp spring 48. Here, also other connection types such as screwing terminals may be used. It is apparent that the invention can also be provided with only one contact clamp, or with more than two contact clamps.

Furthermore, the connection device has a dielectric carrier 50, preferably made from plastic, which carrier has a base plate 50a, whose lower side defines the primary joint surface to the solar module 54, and to which plate the contact clamps are attached. The contact clamp has a substantially U-shaped, metallic holding frame 51 preferably made from copper, which frame is locked at the carrier 50 bay means of snap-fits.

FIG. 6 shows the contact clamp 22 in the open state. The clamp spring 32 has two latching studs 54, which are resolvably clamped in recesses 53 in the metallic holding frame 51, in the open mounting state. In the contact state, the contact spring 32 is pretensioned against the counter clamp 36, and the latching studs 54 are latched behind corresponding lugs 55 in the metallic holding frame 51 (see FIG. 5). This provides for a permanent and secure electric contact.

Furthermore, the clamp spring 32 is mounted in slotted bearing openings 58 by means of bearing studs 56. Therefore, the clamp spring 32 may easily be inserting, when mounting the connection and junction box, and is secured due to the position of the flat bearing stud 56, which position is rotated with respect to the slot 60 in the mounting state and in the contact state. The clamp spring 32 is punched from sheet steel, and substantially U-shaped curved.

The metallic holding frame 51 may furthermore have a dielectric connection element for the bypass-diode.

Referring again to FIGS. 3-5, the bending section 21a of the deflection arm 21 and the clamp spring 32 are consecutively caused to pivot because of the housing 2 and the connection device 20 acting together by means of the actuation elements 16 and 18. At the end of the pivoting, the clamp spring latches with its latching studs in the metallic holding frame 51, when in contact state or in operating state. By pretensioning the clamp spring 32, a permanent and predefined pressing force between the flat conductor band 28 and the conducting counter clamp element 16 is established.

It is apparent to the person skilled in the art that the above described embodiments should be understood as examples, and that the invention is not limited to them, but can be varied in a variety of ways without leaving the scope of the invention. E.g., the connection and junction box may have a plurality of contact clamps for contacting a plurality of flat conductor bands in one box. Furthermore, it is apparent that the features also individually define essential parts of the invention, even if they are commonly described together with other features, not depending, whether they are disclosed in the description, the figures, or otherwise.

The invention claimed is:

1. A connection and junction box (1) for a photovoltaic solar module (24) having flexible flat conductor bands (28) protruding from the surface of the solar module,
   wherein the connection and junction box (1) has an insertion mouth (26) at its side in mounted state facing the solar module (24) for receiving at least one of the flexible flat conductor bands (28) of the solar module (24), and comprising a housing (2) for attaching to the solar module (24) and a connection device (20) positioned in the housing (2) for engaging the flexible flat conductor band (28),
   wherein the connection device (20) has an electrical contact clamp (22) for establishing a clamp contact with the flexible flat conductor band (28), and
   wherein a deflection arm (21) bends the flexible flat conductor band (28) towards the contact clamp (22) after inserting through the insertion mouth (26) into the connection and junction box (1) such that after bending, the flexible flat conductor band is electrically contactable by means of the contact clamp (22),
   wherein the housing (2) is movable with respect to the connection device (20), and a second actuation element

(18) is arranged at the housing (2), said second actuating element closing the contact clamp (22) in response to a movement of the housing (2) with respect to the connection device (20), in order to establish the electrical contact with the flat conductor band (28), and wherein the housing (2) and the connection device (20) are slideable with respect to each other by means of a sliding device (14, 15), and, when attaching the connection and junction box to the solar module (24), the housing (2) is slid with respect to the connection device (20), by what a first actuation element (16) actuates the deflection arm (21) during the attaching process, and the second actuation element (18) closes the contact clamp (22), in order to establish the electric contact with the flat conductor band (28).

2. The connection and junction box (1) according to claim 1, wherein the housing (2) is movable with respect to the connection device (20), and the first actuation element (16) is arranged at the housing (2), to actuate the deflection arm (21) in response to a movement of the housing (2) with respect to the connection device (20), and to effect bending the flexible flat conductor band (28).

3. The connection and junction box (1) according to claim 2, wherein the sliding device (14, 15) comprises a guide sleeve (15) and an alignment pin (14), which grip to each other in mounting state (FIG. 3) such that on the one hand in the mounting state, the connection device (20) in the housing (2) is secured against falling out, and on the other hand, when mounting onto the solar module (24), this gripping is superable by means of applying a force to the housing (2) against the solar module (24), in order to slide the housing (2) with respect to the connection device (20) supported by the solar module (24) till the housing (2) engages the solar module (24), and to consecutively actuate the deflection arm (21) and to close the contact clamp (22).

4. The connection and junction box (1) according to claim 1, wherein the contact clamp (22) has a clamp spring (32) and a counter clamp element (36), and wherein the electrical contact with the flat conductor band (28) is closed by moving at least one of the clamp spring (32) or the counter clamp element (36) in response to the actuation by means of the second actuation element (18).

5. The connection and junction box (1) according to claim 4, wherein the clamp spring (32) and/or the counter clamp element (36) is pivotably mounted at the connection device (20), and the electrical contact with the flat conductor band (28) is closed by means of pivoting of at least one of the clamp spring (32) or the counter clamp element (36), in response to the actuation by means of the second actuation element (18).

6. The connection and junction box (1) according to claim 4, wherein the clamp spring (32) has an actuation section (38), with which the actuation element (18) of the housing (2) interacts, in order to close the contact clamp (22), and wherein the actuation section (38) comprises a curved and an substantially linear section (40, 42) of the clamp spring (32).

7. The connection and junction box (1) according to claim 4, wherein the contact clamp (22) has a latching mechanism (54, 56), by means of which the clamp spring (32) is latched in the contact state.

8. The connection and junction box (1) according to claim 4, wherein the contact clamp (22) is under tension in the closed and latched state for clamping the flat conductor band between the clamp spring (32) and the counter clamp element (36) with a permanent clamping force.

9. The connection and junction box (1) according to claim 4, wherein the contact clamp (22) has a holding frame (51), and the clamp spring (32) is pivotably mounted in bearing openings in the holding frame (51) by means of bearing studs (56).

10. The connection and junction box (1) according to claim 9, wherein the holding frame (51) is produced from electrically conductive material having a generally U-shaped configuration, and a cable connection clamp (46) for connecting the connecting cable is comprised, wherein the cable connection clamp (46) is suspended in the same holding frame (51) as the associated contact clamp (22) for the flat conductor band (28).

11. The connection and junction box (1) according to claim 9, wherein the connection device (20) has a dielectric carrier (50), the holding frame (50) being mounted in said dielectric carrier (50).

12. A connection and junction box (1) for a photovoltaic solar module (24) having flexible flat conductor bands (28) protruding from the surface of the solar module, comprising:
a housing (2) for being attached to the solar module (24),
a connection device (20) positioned in the housing, the connection device (20) having an electrical contact clamp (22) for establishing a clamp contact with the flexible flat conductor band (28),
an insertion mouth (26) at the lower side of the connection and junction box (1), wherein the insertion mouth (26) is significantly wider than the flexible flat conductor band (28) for unguidedly and contactlessly inserting the flexible flat conductor band (28) from below into a free insertion area (30) of the housing (2), which free insertion area is outside the contact clamp (22),
a deflection arm (21), in said housing, said deflection area bending the flexible flat conductor band (28) from the free insertion area (30) towards the contact clamp (22) after insertion, wherein the contact clamp (22) is open during the bending process, and defines a catch area (31) for receiving the flexible flat conductor band (28) so that the flexible flat conductor band (28) is bent into the open catch area (31) of the contact clamp (22) by means of the deflection arm (21), and that the flexible flat conductor band (28) is electrically contactable by closing the contact clamp, only after bending.

13. A method for connecting a connection and junction box (1) to a photovoltaic solar module, comprising the steps of:
providing a solar module (24) having flexible flat conductor bands (28) protruding from the surface (24a) of the solar module (24),
providing a connection and junction box (1), which comprises a housing (2) and a connection device (20) positioned in the housing (2), with an electrical contact clamp (22) for establishing a clamp contact with at least one of the flexible flat conductor bands (28), and which has an insertion mouth at the lower side of the connection and junction box (1),
attaching the connection and junction box (1) to the solar module (24), wherein the connection and junction box (1) is put over the flexible flat conductor band (28), and the connection device (20) is slidably arranged in the housing (2), and superbly grippedly fixed so that the connection device does not fall out of the housing, when being attached, wherein the connection device protrudes downwardly out of the housing (2) so that when being attached, at first only the connection device (20) engages the surface (24a) of the solar module (24),
supplying a force to the housing (2) against the solar module (24) such that the housing (2) is slid relative to the connection device (20) until the housing (2) also engages the solar module (24), wherein the flexible flat conductor band (28) is automatically contacted in the connection and junction box (1) in response to the relative shifting between the housing (2) and the connection device (20).

14. A connection and junction box (1) for a photovoltaic solar module (24) having flexible flat conductor bands (28) protruding from the surface of the solar module, the junction box (1) having a side which faces the solar module in mounted state on the solar module (24) and comprising:

- a housing (2) for attaching the junction box to the solar module (24);
- at said side an insertion mouth (26) for receiving at least one of said flexible flat conductor bands (28) of the solar module (24);
- a connection device (20) positioned in the housing (2) and comprising an electrical contact claim (22); and
- a deflection arm (21) in the housing, wherein the deflection arm is positioned to engage and bend the flexible flat conductor band (28) towards the contact clamp (22) after inserting the flexible flat conductor band through the insertion mouth (26) into the junction box (1) such that after bending, the bent flexible flat conductor band can be clamped and electrically contacted by closing the contact clamp (22).

15. A photovoltaic solar module (24) having flexible flat conductor bands (28) protruding from the surface (24*a*), and at least one connection and junction box (1) according to claim 14 mounted on the solar module (24).

* * * * *